(12) United States Patent
Peng et al.

(10) Patent No.: US 9,054,130 B2
(45) Date of Patent: Jun. 9, 2015

(54) BOTTLE-NECK RECESS IN A SEMICONDUCTOR DEVICE

(75) Inventors: Eric Peng, Hsinchu County (TW);
Chao-Cheng Chen, Shin-Chu (TW);
Ming-Hua Yu, Hsinchu County (TW);
Ying Hao Hsieh, Hsinchu (TW);
Tze-Liang Lee, Hsinchu (TW);
Chii-Horng Li, Jhu-Bei (TW);
Syun-Ming Jang, Hsin-Chu (TW);
Shih-Hao Lo, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 358 days.

(21) Appl. No.: 12/841,763

(22) Filed: Jul. 22, 2010

(65) Prior Publication Data
US 2011/0049567 A1 Mar. 3, 2011

Related U.S. Application Data

(60) Provisional application No. 61/237,565, filed on Aug. 27, 2009.

(51) Int. Cl.
| | | |
|---|---|---|
| *H01L 21/302* | (2006.01) | |
| *H01L 29/66* | (2006.01) | |
| *H01L 21/306* | (2006.01) | |
| *H01L 21/3065* | (2006.01) | |
| *H01L 29/165* | (2006.01) | |

(52) U.S. Cl.
CPC .... *H01L 29/66636* (2013.01); *H01L 21/30608* (2013.01); *H01L 21/3065* (2013.01); *H01L 29/165* (2013.01)

(58) Field of Classification Search
USPC .......................................................... 438/197
See application file for complete search history.

(56) References Cited

U.S. PATENT DOCUMENTS

| | | | |
|---|---|---|---|
| 2004/0124494 A1* | 7/2004 | Ciovacco et al. | 257/510 |
| 2006/0024898 A1 | 2/2006 | Chidambaram et al. | |
| 2008/0146034 A1* | 6/2008 | Shen et al. | 438/700 |
| 2008/0277699 A1* | 11/2008 | Chakravarthi et al. | 257/289 |

* cited by examiner

*Primary Examiner* — Jack Chen
(74) *Attorney, Agent, or Firm* — Haynes and Boone, LLP (57) ABSTRACT

The present disclosure provides a method for fabricating a semiconductor device that includes providing a silicon substrate, forming a gate stack over the silicon substrate, performing a biased dry etching process to the substrate to remove a portion of the silicon substrate, thereby forming a recess region in the silicon substrate, performing a non-biased etching process to the recess region in the silicon substrate, thereby forming a bottle-neck shaped recess region in the silicon substrate, and epi-growing a semiconductor material in the bottle-neck shaped recess region in the silicon substrate. An embodiment may include a biased dry etching process including adding HeO2 gas and HBr gas. An embodiment may include performing a first biased dry etching process including N2 gas and performing a second biased dry etching process not including N2 gas. An embodiment may include performing an oxidation process to the recess region in the silicon substrate by adding oxygen gas to form silicon oxide on a portion of the recess region in the silicon substrate. As such, these processes form polymer protection to help form the bottle-neck shaped recess.

20 Claims, 6 Drawing Sheets

BOTTLE-NECK RECESS IN A SEMICONDUCTOR DEVICE

CROSS REFERENCE TO RELATED APPLICATIONS

The present application claims priority to U.S. Provisional Application Ser. No. 61/237,565, filed on Aug. 27, 2009, the disclosure of which is incorporated herein by reference in its entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

In a semiconductor fabrication process, it may be desirable to form recesses in the semiconductor substrate. However, traditional isotropic/v-shaped recesses in the substrate are generally not applied to 32 angstrom devices and below and generally do lead to poor device performance such as, poor junction leakage performance, and severe Si pull back after an SiGe epitaxy growth. In addition, a lightly doped drain (LDD) at a surface of the substrate under the gate has a high cutout. Thus, it is desirable to have a bottle-neck shaped recess in a semiconductor device to improve upon the disadvantages discussed above.

SUMMARY

In an embodiment, the present disclosure provides a method for fabricating a semiconductor device that includes providing a silicon substrate, forming a gate stack over the silicon substrate, performing a biased dry etching process to the substrate to remove a portion of the silicon substrate, thereby forming a recess region in the silicon substrate, performing a non-biased etching process to the recess region in the silicon substrate, thereby forming a bottle-neck shaped recess region in the silicon substrate, and epi-growing a semiconductor material in the bottle-neck shaped recess region in the silicon substrate. An embodiment may include a biased dry etching process including adding HeO2 gas and/or HBr gas. An embodiment may include performing a first biased dry etching process including N2 gas and performing a second biased dry etching process substantially void of N2 gas. An embodiment may include performing an oxidation process to the recess region in the silicon substrate by adding oxygen gas to form silicon oxide on a portion of the recess region in the silicon substrate.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
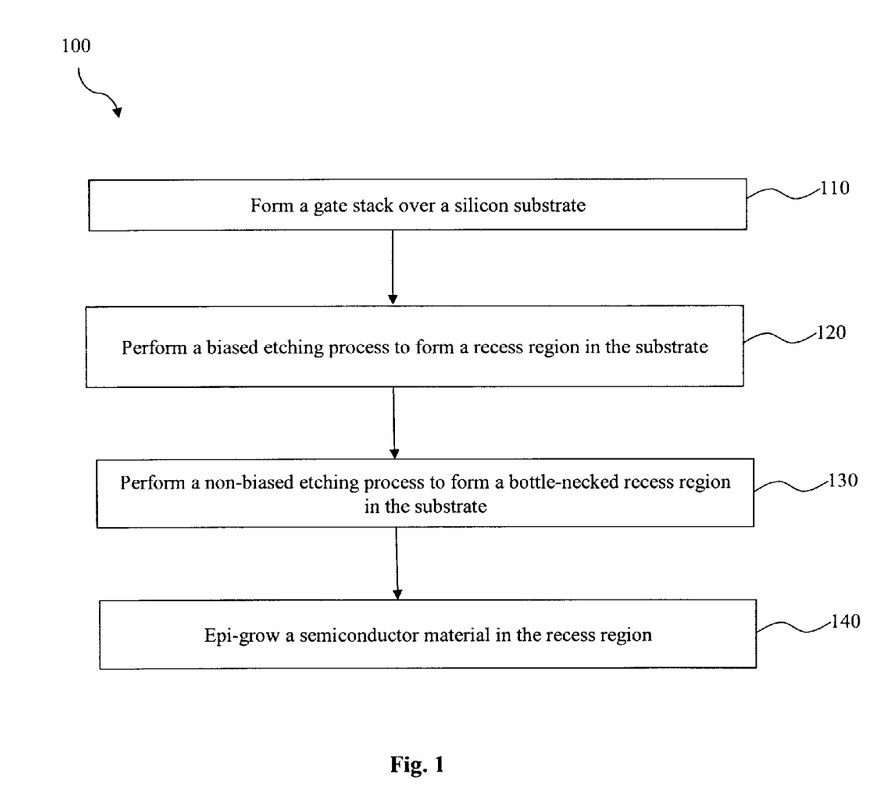
FIG. 1 is a flowchart illustrating an embodiment of a method for forming a spacer according to various aspects of the present disclosure.
Figure 4:
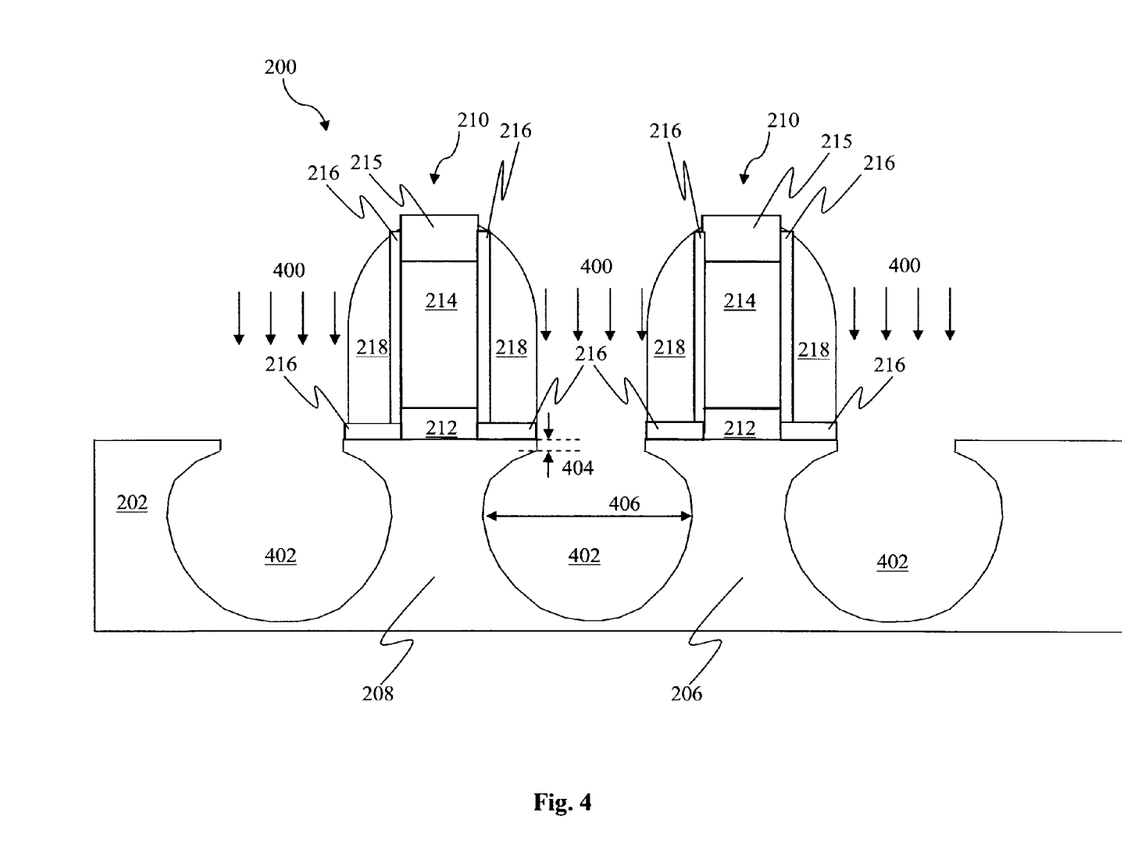
Figure 5:
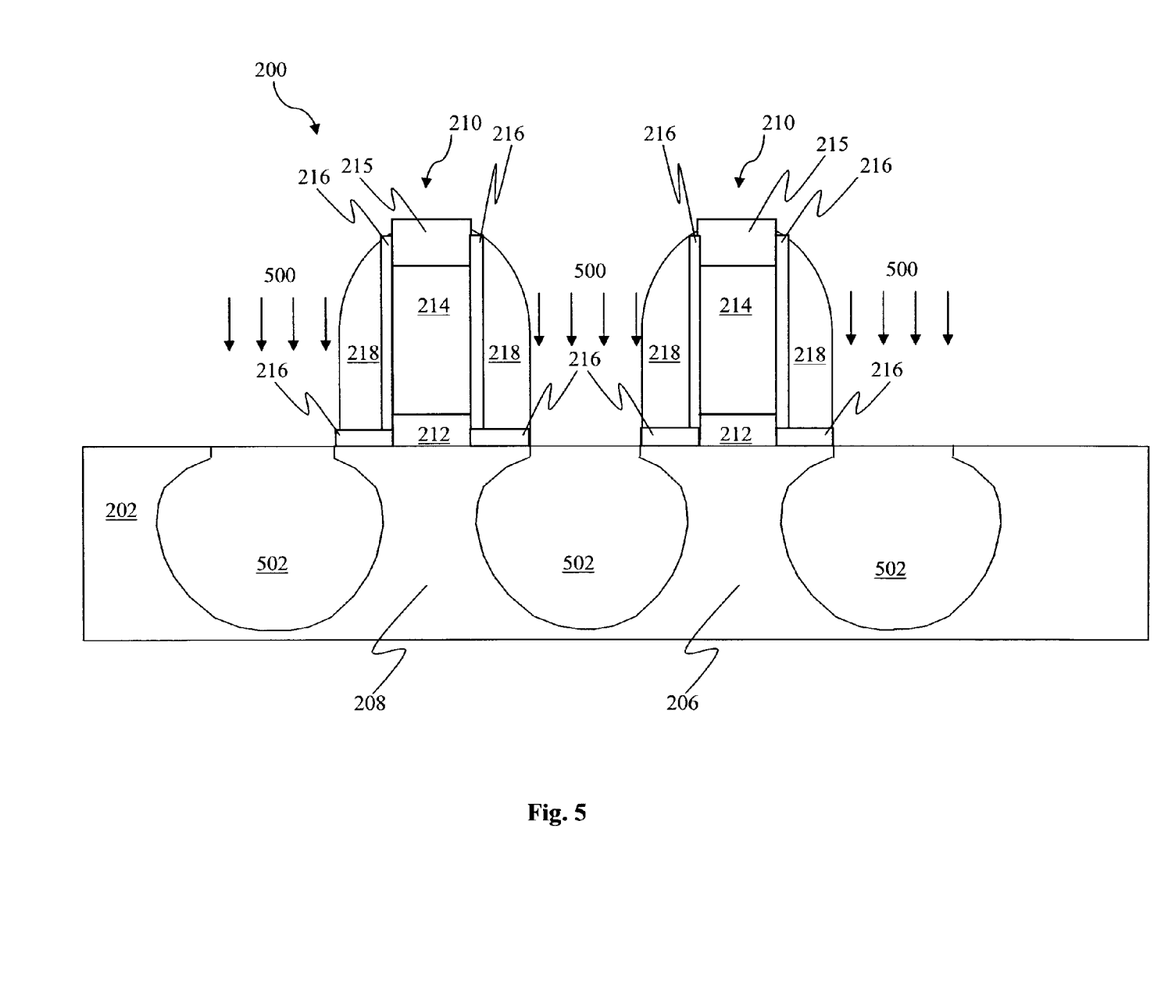
Figure 6:
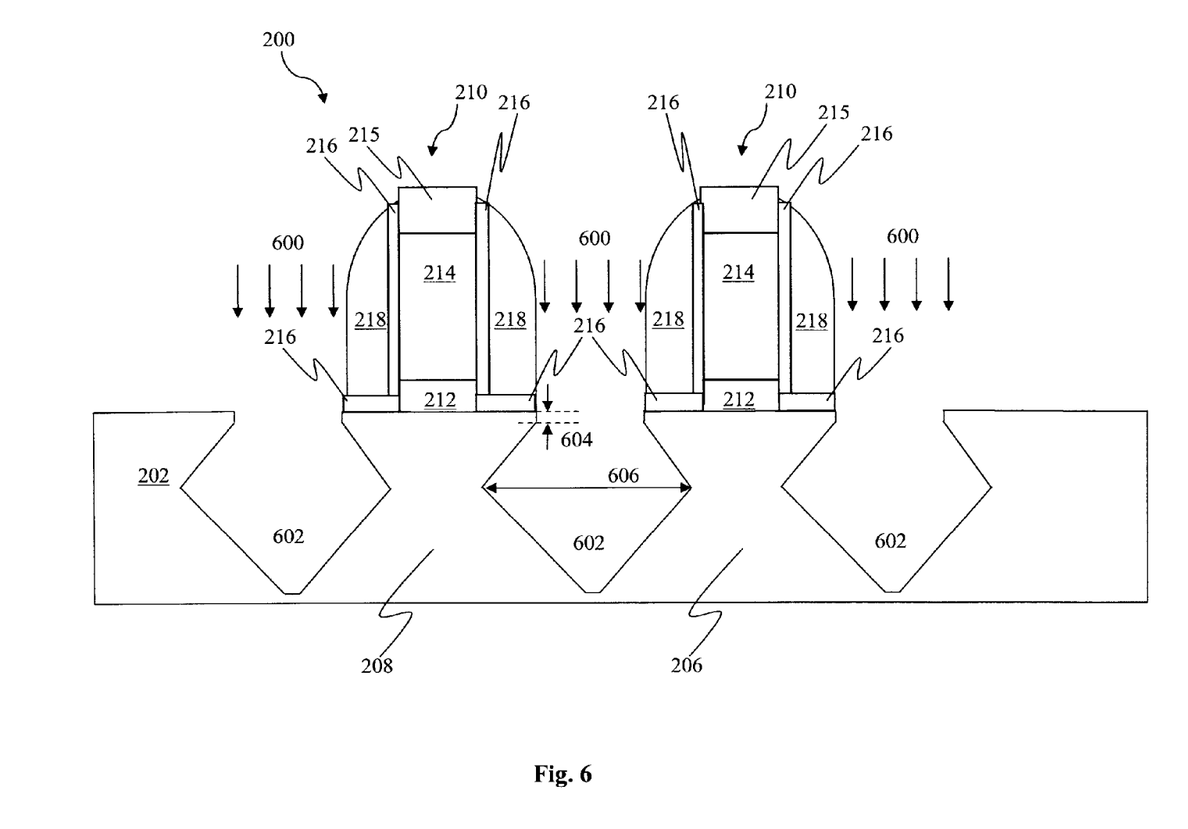
FIG. 6 illustrates an alternative embodiment of a semiconductor device according to the method of FIG. 1.

Illustrated in FIG. 1 is a flowchart of a method 100 for forming a bottle neck-like recess in a strained semiconductor device according to various aspects of the present disclosure. FIGS. 2-5 are cross sectional views of a semiconductor device 200 at various stages of fabrication according to the method 100 of FIG. 1. FIG. 6 illustrates an alternative embodiment of a semiconductor device according to the method 100 of FIG. 1. The semiconductor device 200 may be an integrated circuit, or portion thereof, that may comprise memory circuits and/or logic circuits, passive components such as resistors, capacitors, and inductors, and active components such as P-channel field effect transistors (pFET), N-channel FET (nFET), metal-oxide semiconductor field effect transistors (MOSFET), or complementary metal-oxide semiconductor (CMOS) transistors. It should be noted that some features of the semiconductor device 200 may be fabricated with a CMOS process flow. Accordingly, it is understood that additional processes may be provided before, during, and after the method 100 of FIG. 1, and that some other processes may only be briefly described herein.

Figure 2:
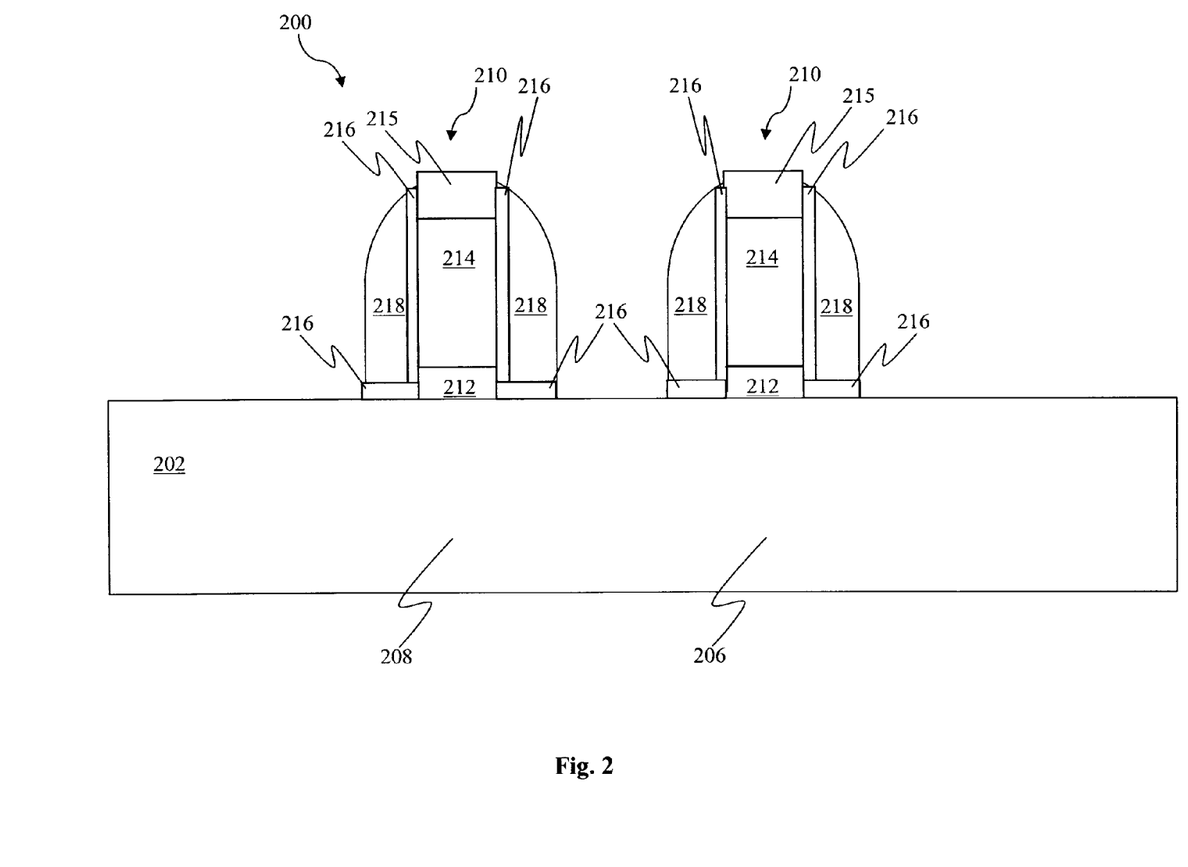
FIGS. 2-5 illustrate cross sectional views of an embodiment of a semiconductor device at various stages of fabrication according to the method of FIG. 1.

Referring to FIG. 1, the method 100 begins with block 110 in which a gate stack is formed over a silicon substrate. Referring now to FIG. 2, a semiconductor device 200 is illustrated at an intermediate stage of fabrication. The semiconductor device 200 may include a substrate 202, such as a silicon substrate. The substrate 202 may include various doping configurations depending on design requirements as is known in the art. The substrate 202 may also include other elementary semiconductors such as germanium and diamond. Alternatively, the substrate 202 may include a compound semiconductor and/or an alloy semiconductor. In the present embodiment, the substrate 202 includes a silicon material.

The semiconductor device 200 may further include an isolation structure, such as a shallow trench isolation (STI) feature formed in the substrate 202 for isolating active regions 206 and 208 in the substrate, as should be understood in the art. The isolation structure may include a dielectric material and may be formed of silicon oxide, silicon nitride, silicon oxynitride, fluoride-doped silicate (FSG), and/or a low-k dielectric material known in the art. The active regions 206 and 208 may be configured for an N-type metal-oxide-semiconductor transistor device (referred to as NMOS), or a P-type metal-oxide-semiconductor transistor device (referred to as PMOS).

The semiconductor device 200 may include a gate stack 210 formed over the active regions 206 and 208. The gate stack 210 may include an interfacial layer (not shown) formed over the substrate 202. The interfacial layer may include silicon oxide ($SiO_2$) or silicon oxynitride (SiON) having a thickness of about 5 to about 10 angstrom (A). The gate stack 210 may further include a high-k dielectric layer 212 formed over the substrate 202. The high-k dielectric layer 212 may include hafnium oxide ($HfO_x$). Alternatively, the high-k dielectric layer 212 may optionally include other high-k dielectrics such as LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides, or other suitable materials. The high-k dielectric layer 212 may include a thickness ranging from about 10 to about 40 angstrom (A). The high-k dielectric layer 212 may be formed by atomic layer deposition (ALD) or other suitable technique.

The gate stack 210 may further include a gate electrode 214 formed over the high-k dielectric layer 212. The gate electrode 214 may include any metal material suitable for forming a metal gate or portion thereof, including work function layers, liner layers, interface layers, seed layers, adhesion layers, barrier layers, etc. For example, the metal layer may include TiN, TaN, ZrN, HfN, VN, NbN, CrN, MoN, WN, TiAl, TiAlN, or combinations thereof. The gate electrode 214 may be formed by ALD, physical vapor deposition (PVD or sputtering), chemical vapor deposition (CVD), or other suitable processes. The gate electrode 214 may further include multiple layers, such as, an active material layer formed over the metal layer. The active material layer may be a metal layer and may include Al, Cu, W, Ti, Ta, Cr, V, Nb, Zr, Hf, Mo, Ni, Co, or combinations thereof. Alternatively, the active material layer may be a polysilicon (or poly) layer. The active material layer may be formed by various deposition techniques such as PVD, CVD, ALD, plating, or other suitable techniques. A silicide layer 215 may be formed over the gate electrode 214 to reduce contact resistance.

The gate stack 210 may also include a hard mask layer 215/216 formed along a portion of the gate electrode 214. The hard mask layer 215/216 may be used to pattern the underlying layers and may include a dielectric material such as silicon oxide, silicon nitride, silicon oxynitride, or silicon carbide. In the present embodiment, the hard mask layer 215/216 includes silicon oxide. Dummy spacers 218 may also be formed on either side of the gate stack 210. The dummy spacers 218 may include a dielectric material such as silicon nitride or silicon oxide. In the present embodiment, the dummy spacers 218 include silicon nitride. The dummy spacers 218 may be formed by depositing a dummy spacer layer over the gate stack 210 and the substrate 202, and then performing a dry etching process on the dummy spacer layer. Other elements may be used for the hard mask layer 215/216 and/or for the dummy spacers 218.

Figure 3:
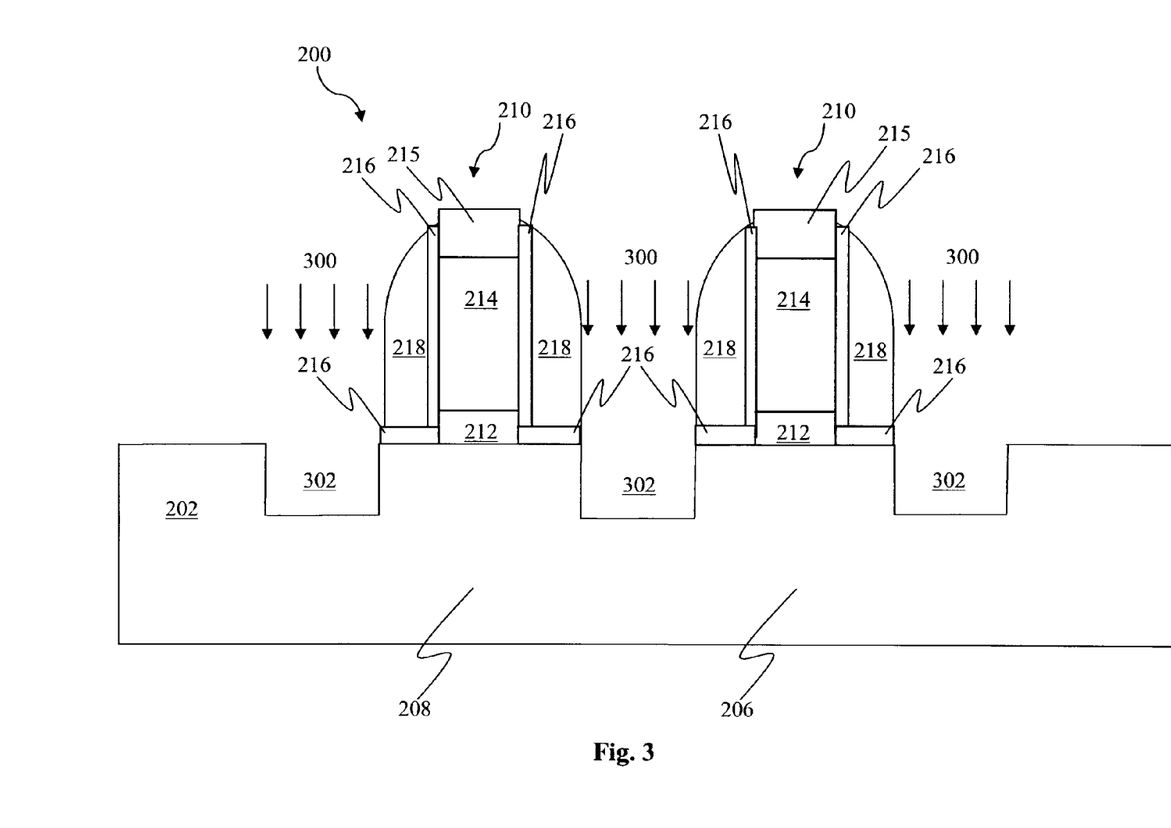

The method 100 continues with block 120 in which a biased etching process is performed on the semiconductor device 200 to form one or more recess regions in the silicon substrate 202. Referring now to FIG. 3, the etching process 300 may be performed to the substrate 202 to form recess regions 302. The etching process 300 is a biased dry etching process. In an embodiment, the etching process 300 may use a plasma gas, wherein the etching process 300 uses charged ions to direct the etch. The etching process 300 may use a HBr and/or Cl2 plasma gas as an etchant. The etching process 300 may also include He, O2 and/or HeO2 as a passivation gas. In an embodiment, this process is performed on devices 200 where gate to gate spacing is less than about 65 nm. The etching process 300 may be performed at a temperature range of about 40° C.-60° C. Thus, in an embodiment, the etching process 300 may be a biased dry etching process using HBr+HeO2 gases. As should be understood the addition of HeO2 and/or HBr gas to the etching chamber in the dry etching process 300 forms a polymer layer on the sidewalls of the recess regions 302 to protect the active regions 206, 208 (e.g. a lightly doped drain (LDD) area) in sequence from etching away. Also, in the embodiments provided, the etching process 300 may tune a bias voltage for the plasma gas to achieve desired profiles for recess regions 302.

In another embodiment, the etching process 300 of block 120 may be performed as a biased dry etching process using N2 gas in a first step and then again substantially without N2 gas in the etching chamber in a second step. Again, the etching process 300 may use a plasma gas, wherein the etching process 300 uses charged ions to direct the etch. The etching process 300 may use a HBr and or Cl2 plasma gas as an etchant. The etching process 300 may also include He, O2 and/or HeO2 as a passivation gas. In an embodiment, this process is performed on devices 200 where gate to gate spacing is greater than about 65 nm. The etching process 300 may be performed at a temperature range of about 40° C.-60° C. Thus, in this embodiment, the etching process 300 may be a biased dry etching process including two or more process steps, one step using N2 in the etching process 300, and one step being substantially void of N2 during the dry etching process.

In another embodiment, the etching process 300 of block 120 may be performed as a biased dry etching process. Once again, the etching process 300 may use a plasma gas, wherein the etching process 300 uses charged ions to direct the etch. The etching process 300 may use a HBr and or Cl2 plasma gas as an etchant. The etching process 300 may also include He, O2 and/or HeO2 as a passivation gas. In an embodiment, this process is performed on devices 200 where gate to gate spacing is greater than about 65 nm. The etching process 300 may be performed at a temperature range of about 40° C.-60° C. Then, after the etching process 300, the recess regions 302 are oxidized. The oxidization step adds O2 to the sidewalls of the recess regions 302 to create a silicon oxide at the sidewall areas of the recess regions 302 to protect the sidewall by slowing future etching processes.

The method 100 continues to block 130 in which a non-biased etching process is performed on the semiconductor device 200 to further form the recess regions in the silicon substrate 202 as isotropic recesses with bottle-neck shapes. In an embodiment, the recess regions have a round-bottom shape. The term bottle-neck refers to the sidewall area 404 below the surface of the substrate 202 which is not etched away with the etching process 400 due to the polymerization of the sidewalls of the recesses 302 discussed above, with respect to block 120 of method 100. Referring now to FIG. 4, the non-biased etching process 400 may be performed to the substrate 202 to further form recess regions 302 to become recess regions 402 having width 406. The width 406 may be tuned in the etching process 400 to provide for a bottleneck shape below the gate 210 so that a lightly doped drain (LDD) area is under the surface of the substrate under the gate 210, thereby lowering cutout. The bottle-neck area sidewalls 404 may be angled, with respect to the surface of the substrate 202 at a range of 70°-100° down and inward toward the gate 210. The angle may be controlled by bias voltage or by adding the etchant at different flow rates. In an embodiment, the angle of the sidewalls 404 is approximately 80° with respect to the surface of the substrate 202. The length of the sidewalls 404 may be any length, however, in an embodiment of a 32 nm node, the length of the sidewalls 404 may be approximately 2-10 nm. In another embodiment of a 22 nm node, the length of the sidewalls 404 may be approximately 2-5 nm. The etching process 400 is a non-biased dry etching process to form round-bottom recesses 402. In an embodiment, the etching process 400 may use a plasma gas, such as a carbon hydro-fluoric based plasma gas, as an etchant. The etching process 400 may use a Cl2, NF3 and/or SF6 plasma gas as an etchant. The etching process 400 may be performed at a temperature range of about 40° C.-60° C. Thus, in an embodiment, the etching process 400 may be a non-biased dry etching process. Also, in the embodiments provided, the etching process 300 may tune a bias voltage for the plasma gas to achieve desired profiles for recess regions 302.

In another embodiment, the method 100 continues to block 130 in which a non-biased etching process is performed on the semiconductor device 200 to further form the recess regions in the silicon substrate 202 as diamond-like recesses with bottle-neck shapes. In an embodiment, the recesses may have a v-bottom shape. The term bottle-neck refers to the sidewall area 604 below the surface of the substrate 202 which is not etched away with the etching process 600 due to the polymerization of the sidewalls of the recesses 302 discussed above, with respect to block 120 of method 100. Referring now to FIG. 6, the wet etching process 600 may be performed to the substrate 202 to further form recess regions 302 to become recess regions 602 having width 606. The width 606 may be tuned in the etching process 600 to provide for a bottleneck shape below the gate 210 so that a lightly doped drain (LDD) area is under the surface of the substrate under the gate 210, thereby lowering cutout. The bottle-neck area sidewalls 604 may be angled, with respect to the surface of the substrate 202 at a range of 70°-100° down and inward toward the gate 210. The angle may be controlled by bias voltage or by adding the etchant with different flow rates. In an embodiment, the angle of the sidewalls 604 is approximately 80° with respect to the surface of the substrate 202. The length of the sidewalls 604 may be any length, however, in an embodiment of a 32 nm node, the length of the sidewalls 604 may be approximately 2-10 nm. In another embodiment of a 22 nm node, the length of the sidewalls 604 may be approximately 2-5 nm. The etching process 600 is a non-biased wet etching process to form diamond-like recesses 602. The wet etching process 600 may use a HF and/or TMAH acid as a non-biased etchant. Thus, in an embodiment, the etching process 600 may be a wet etching process. It should be understood that the steps performed in block 130 of method 100 may form the recesses 402 or 602 in FIG. 4 or 6, respectively, depending on whether isotropic or diamond-like recesses are desired.

The method 100 continues to block 140 in which a semiconductor material is epi-grown in the recess regions. Referring now to FIG. 5, a semiconductor material 502 may be formed in the recess regions 402 through a selective epigrowth process (SEG) 500 or other suitable epi-technology process. The SEG process 500 may use a special CVD process. For example, the special CVD process may implement a low deposition rate or a low substrate temperature. Alternatively, ALD may be used for the SEG process 500. The semiconductor material 502 may be a material different from the silicon substrate 202. This may be done to create strain between the semiconductor material 502 and the substrate 202 so that carrier mobility of the active regions 206 and 208 may be enhanced, which may allow for a greater channel current without having to increase a gate voltage. Therefore, the semiconductor material 502 may be referred to as a "strained" semiconductor material, and the interface between the silicon substrate 202 and the semiconductor material 502 in the recess regions may be referred to as a strained interface. An advantage of the present embodiment is enhanced carrier mobility due to the strained feature. Additionally, the strained feature may be raised above the substrate 202. In one embodiment, the active regions 206, 208 may be a PMOS device, and the semiconductor material 502 may include silicon germanium (SiGe). In another embodiment, the active regions 206, 208 may be an NMOS device, and the semiconductor material 502 may include silicon carbide (SiC).

It should be understood that the dummy spacers 218 may be removed by an etching process. After the dummy spacers 218 are etched away, lightly doped source/drain (referred to as LDD) regions may be formed in the substrate 202 on either side of the gate stack 210 by an ion implantation or diffusion process as is known in the art. In one embodiment, the active region 208 may be a PMOS device, and P-type dopants such as boron may be implanted in the PMOS device 208. In another embodiment, the active region 208 may be an NMOS device, and N-type dopants such as phosphorus or arsenic may be implanted in the NMOS device 208. A portion of the LDD regions may be formed in the silicon substrate 202, and another portion of the LDD regions 235 may be formed in the semiconductor material 502 in the recess regions.

It is also to be understood that other layers may be formed over the gate stack 210 and/or the substrate 202 and/or the semiconductor material 502. For example, layers may be formed over the substrate 202 and the gate stack 210 by CVD, ALD, or other suitable technique. The layers may include an oxide material, such as silicon oxide, silicon nitride.

It is understood that the method 100 may continue with additional steps to complete the fabrication of the semiconductor device 200. For example, heavy doped source/drain regions may be formed in the substrate 202 on either side of the gate stack 210 using ion implantation or diffusion with suitable N-type or P-type dopants. The heavy doped source/drain regions may be substantially aligned with the outer sides of the features. Silicide features may be formed on the source/drain regions and the poly layer by a salicidation process. A contact etch stop layer (CESL) may be formed over the substrate. An interlayer dielectric (ILD) layer may be formed over the CESL. In addition, contacts and interconnects may also be formed to establish electrical connections for the semiconductor device 200.

In summary, the methods and devices disclosed herein take advantage of forming bottle-neck shaped recess regions in a silicon substrate of a semiconductor device and filling the recess regions with a semiconductor material. In doing so, the present disclosure offers several advantages over prior art devices. Advantages of the present disclosure include increased device 200 performance, drain induced barrier lowering (DIBL) reduction from cross lot check, better junction leakage performance, better Si pullback after SiGe epitaxy growth and better resistance and field mobility. It is understood that different embodiments disclosed herein offer different advantages, and that no particular advantage is necessarily required for all embodiments.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, the embodiments disclosed herein may be implemented in a gate replacement process (or gate last process), or a hybrid process that includes a gate first process and gate last process.

What is claimed is:

1. A method of forming a semiconductor device, comprising:
   providing a semiconductor substrate having a top surface;
   forming a gate stack over the top surface of the semiconductor substrate including forming a gate dielectric and a gate electrode over the semiconductor substrate;
   recessing the semiconductor substrate, wherein the recessing includes sequentially:
      an anisotropic etch to form a recess in the semiconductor substrate; and
      then an isotropic etch which increases a width of the recess in the semiconductor substrate while maintaining a top portion of the recess substantially unetched, thereby providing a greater width of the recess within the semiconductor substrate and providing a width of the top portion of the recess defined at the top surface of the semiconductor substrate that is less than the greater width; and
   filling a stress material into the recess to form a source/drain region.

2. The method of claim 1, wherein the anisotropic etch is a plasma etch.

3. The method of claim 2, wherein the plasma etch is a nitrogen-containing plasma etch.

4. The method of claim 1, further comprising:
   forming a pair of spacers at two sides of the gate electrode.

5. The method of claim 4, including using the pair of spacers as hard masks during the anisotropic etch of the recessing of the semiconductor substrate.

6. The method of claim 4, including wherein the top portion of the recess has a sidewall that are collinear with an edge of one spacer of the pair of spacers after the anisotropic etch.

7. The method of claim 1, wherein the anisotropic etch further includes using HBr during performing of the anisotropic etch.

8. The method of claim 1, further comprising forming a lightly doped source/drain feature in the semiconductor substrate adjacent the gate stack and in the recess after filling the stress material into the recess to form the source/drain region.

9. A method of fabricating a semiconductor device, comprising:
   providing a silicon substrate;
   forming a gate stack over the silicon substrate;
   performing a biased dry etching process to the substrate to remove a portion of the silicon substrate, thereby forming a recess region in the silicon substrate, wherein performing the biased dry etching process to the substrate to remove the portion of the silicon substrate includes performing a first biased dry etching process that includes using $N_2$ and a second biased dry etching process that is substantially void of $N_2$;
   performing a non-biased etching process to the recess region in the silicon substrate, thereby forming a bottle-neck shaped recess region in the silicon substrate; and
   epi-growing a semiconductor material in the bottle-neck shaped recess region in the silicon substrate.

10. The method of claim 9, wherein a bottle-neck portion of the bottle-neck shaped recess region is angled at a range of about 70° to about 100° relative to an upper surface of the silicon substrate.

11. The method of claim 9, wherein the non-biased etching process is a dry etching process.

12. The method of claim 11, wherein the non-biased dry etching process forms a rounded-bottom shaped region in the silicon substrate.

13. The method of claim 9, wherein the biased dry etching process is an anisotropic etching process, and
   wherein the non-biased etching process is an isotropic etching process.

14. A method comprising:
   forming a gate stack over a semiconductor substrate having a pair of spacers abutting sidewalls of the gate stack;
   performing an anisotropic etching process to form a recess in the semiconductor substrate having a first profile having substantially vertical sidewalls; and
   after performing the anisotropic etch, performing an isotropic etching process to modify the first profile of the recess to form a second profile, wherein the second profile is a bottle-neck shaped profile of the recess in the semiconductor substrate, the second profile having a greater width within the semiconductor substrate than at a top region of the recess, the top region being adjacent a top surface of the semiconductor substrate, and wherein the anisotropic etch is such that a portion of the semiconductor substrate below the pair of spacers is unetched and the substantially vertical sidewalls of the top region of the recess having the second profile are maintained during the isotropic etch.

15. The method of claim 14, further comprising epi-growing a semiconductor material in the bottle-neck shaped recess.

16. The method of claim 15, further comprising forming a lightly doped source/drain feature in the semiconductor substrate adjacent the gate stack and in the bottle-neck shaped recess after epi-growing the semiconductor material in the bottle-neck shaped recess.

17. The method of claim 16, wherein the semiconductor material includes one of silicon germanium and silicon carbide.

18. The method of claim 14, wherein the anisotropic etch is a plasma etch.

19. The method of claim 14, wherein a portion of a sidewall of the bottle-neck shaped recess extends along an axis and a portion of a sidewall of a spacer associated with the gate stack extends along the axis such that the portion of the sidewall of the bottle-neck shaped recess and the portion of the sidewall of the spacer associated with gate stack are substantially coplanar.

20. The method of claim 14, wherein the substantially vertical sidewalls of the top region of the recess having the second profile are maintained during the isotropic etch interface with the top surface of the semiconductor substrate.

* * * * *